(12) United States Patent
Hollis

(10) Patent No.: US 10,847,193 B2
(45) Date of Patent: *Nov. 24, 2020

(54) PHASE CONTROL BETWEEN REGULATOR OUTPUTS

(71) Applicant: Micron Technology, Inc., Boise, ID (US)

(72) Inventor: Timothy Mowry Hollis, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 16/428,527

(22) Filed: May 31, 2019

(65) Prior Publication Data

US 2019/0287575 A1  Sep. 19, 2019

Related U.S. Application Data

(63) Continuation of application No. 15/666,320, filed on Aug. 1, 2017, now Pat. No. 10,347,303.

(51) Int. Cl.
*G11C 5/14* (2006.01)
*H02M 3/156* (2006.01)
(Continued)

(52) U.S. Cl.
CPC .......... *G11C 5/147* (2013.01); *G11C 11/4074* (2013.01); *H02M 1/15* (2013.01);
(Continued)

(58) Field of Classification Search
CPC . G11C 11/4074; G11C 7/222; G11C 11/4076; G11C 11/4093; G11C 5/147;
(Continued)

(56) References Cited

U.S. PATENT DOCUMENTS 10,347,303 B2 * 7/2019 Hollis .................. H02M 3/156
2007/0285121 A1  12/2007 Park et al.
(Continued)

FOREIGN PATENT DOCUMENTS

KR    20070053982 A    5/2007
WO    WO-2019027805 A1  2/2019

OTHER PUBLICATIONS

"International Application Serial No. PCT/US2018/043921, International Search Report dated Oct. 18, 2018", 3 pgs.
(Continued)

*Primary Examiner* — Thong Q Le
(74) *Attorney, Agent, or Firm* — Schwegman Lundberg & Woessner, P.A.

(57) ABSTRACT

Various embodiments, disclosed herein, include apparatus and methods to provide separate regulated voltages to an electronic device. Multiple voltage regulators can be provided with phase alignment circuitry coupled to the multiple voltage regulators. The multiple voltage regulators can be structured with each voltage regulator having an output separate from the output of the other voltage regulators. The phase alignment circuitry can provide for relative phases among voltage regulator ripples at the output pins of the multiple voltage regulators to be maintained at a certain relationship. Additional apparatus, systems, and methods are disclosed.

23 Claims, 6 Drawing Sheets

(51) Int. Cl.
*G11C 11/4074* (2006.01)
*H02M 1/15* (2006.01)
*H02M 3/158* (2006.01)
*H02M 1/00* (2006.01)

(52) U.S. Cl.
CPC ........... *H02M 3/156* (2013.01); *H02M 3/158* (2013.01); *H02M 2001/0003* (2013.01); *H02M 2001/008* (2013.01); *H02M 2001/0083* (2013.01); *H02M 2003/1586* (2013.01)

(58) Field of Classification Search
CPC ....... G11C 11/4096; G11C 7/109; G11C 7/22; G11C 7/12; G11C 5/04; G11C 7/1063; G11C 7/1096; G11C 8/12
USPC ....... 365/51, 226, 201, 189.09, 230.03, 220, 365/189.05, 185.23, 189.02, 189.11, 194, 365/230.02, 230.06, 230.08, 143
See application file for complete search history.

(56) References Cited

U.S. PATENT DOCUMENTS

| | | |
|---|---|---|
| 2011/0133704 A1 | 6/2011 | Zambetti et al. |
| 2013/0320763 A1 | 12/2013 | Rozman et al. |
| 2016/0048188 A1 | 2/2016 | Kim |
| 2017/0060213 A1 | 3/2017 | Wu et al. |
| 2017/0179830 A1 | 6/2017 | Tang et al. |
| 2019/0043538 A1 | 2/2019 | Hollis |

OTHER PUBLICATIONS

"International Application Serial No. PCT/US2018/043921, Written Opinion dated Oct. 18, 2018", 8 pgs.

* cited by examiner

PHASE CONTROL BETWEEN REGULATOR OUTPUTS

PRIORITY APPLICATION

This application is a continuation of U.S. application Ser. No. 15/666,320, filed Aug. 1, 2017, which is incorporated herein by reference in its entirety.

BACKGROUND

A number of electronic devices have sections of circuitry that are fed from different voltage sources, forming a number of voltage domains in which the electronic device operates. Voltage regulators may produce a voltage regulator ripple, which is a small unwanted residual variation of the direct current (DC) output of the voltage regulator operating to maintain a prescribed voltage. With independent regulators on a printed circuit board, for example, there is no guarantee of matching frequency or phase between each regulators' output. If connected to a common voltage domain, this results in multi-modal ripple, but does not necessarily complicate voltage domain boundary crossings, for example, VDD domain to VDDQ domain on a dynamic random-access memory (DRAM), where VDD is a primary power supply to the DRAM and VDDQ is a potential to drive a load applied to data output pins or data input/output pins of the DRAM. If independent regulators supply different voltage domains, then crossing domain boundaries may become complicated. For example, one domain could be at a higher than typical voltage while another domain is at a lower than typical voltage, which may result in setup/hold violations, duty cycle problems, etc.

DETAILED DESCRIPTION

The following detailed description refers to the accompanying drawings that show, by way of illustration, various embodiments of the invention. These embodiments are described in sufficient detail to enable those of ordinary skill in the art to practice these and other embodiments. Other embodiments may be utilized, and structural, logical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, common triggers to multiple voltage regulators (VRs) can be used to facilitate alignment in VR ripple across output pins of the multiple VRs. With various regulators on a power management integrated circuit (PMIC) integrated into a common piece of silicon, use of common triggers such as trigger clocks and/or traditional phase-alignment circuitry can be used to align VR ripple across the output pins of the multiple VRs such that relative phases of voltage regulator ripples at the output pins are maintained. Phase alignment is not limited to zero degree offset, phase alignment can include maintenance of a constant offset, which can be, but is not limited to, 90°, 180°, etc. This should greatly simplify boundary crossings between domains sourced from different VR outputs, and should lead directly to more robust designs and relaxed timing budgets.

Consider the following scenarios regarding the issue of boundary crossing. In a first case scenario, independent regulators from different source devices can feed a single domain of a device. In this situation. VR ripple is common across domain boundaries. In a second case, independent regulators from different source devices can feed different domains of a device, which can lead to a boundary crossing problem. In a third case, independent regulators from a common PMIC can feed different domains of a device, which can lead to a boundary crossing problem. To avoid these situations, a structured approach is taught herein in which phase-aligned regulators on a common PMIC feed different domains of a device, providing for simplified boundary crossing. Phase detection and alignment circuitry can be incorporated into a PMIC generating multiple voltage regulator outputs such that the phase detection and alignment circuitry can provide in-phase VR ripple at the PMIC output pins.

Figure 1A:
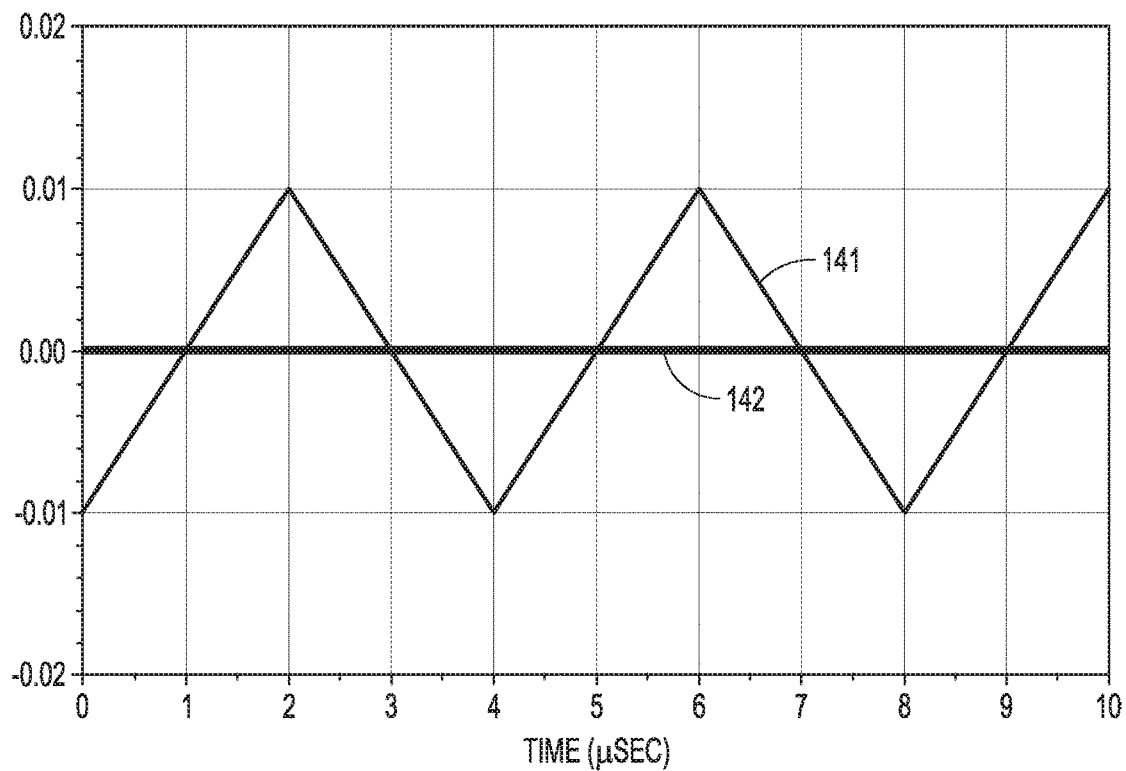
FIGS. 1A-1D show effects on domains of a dynamic random-access memory with respect to voltage regulator ripple passing to the dynamic random-access memory from voltage regulators, according to various embodiments.

FIGS. 1A-1D show effects on VDD and VDDQ domains of a DRAM with respect to VR ripple passing to the DRAM from the voltage regulators. FIG. 1A indicates when VDD and VDDQ come from a common source, or exhibit identical behaviors. Curve 141 represents both voltage of a datapath domain, associated with VDD, and an input/output (I/O) domain, associated with VDDQ, resulting in curve 142, which is a differential voltage between datapath and I/O domains, that is zero. In this case, voltage domain boundary crossings are simplified and the DRAM is more robust.

Figure 1B:
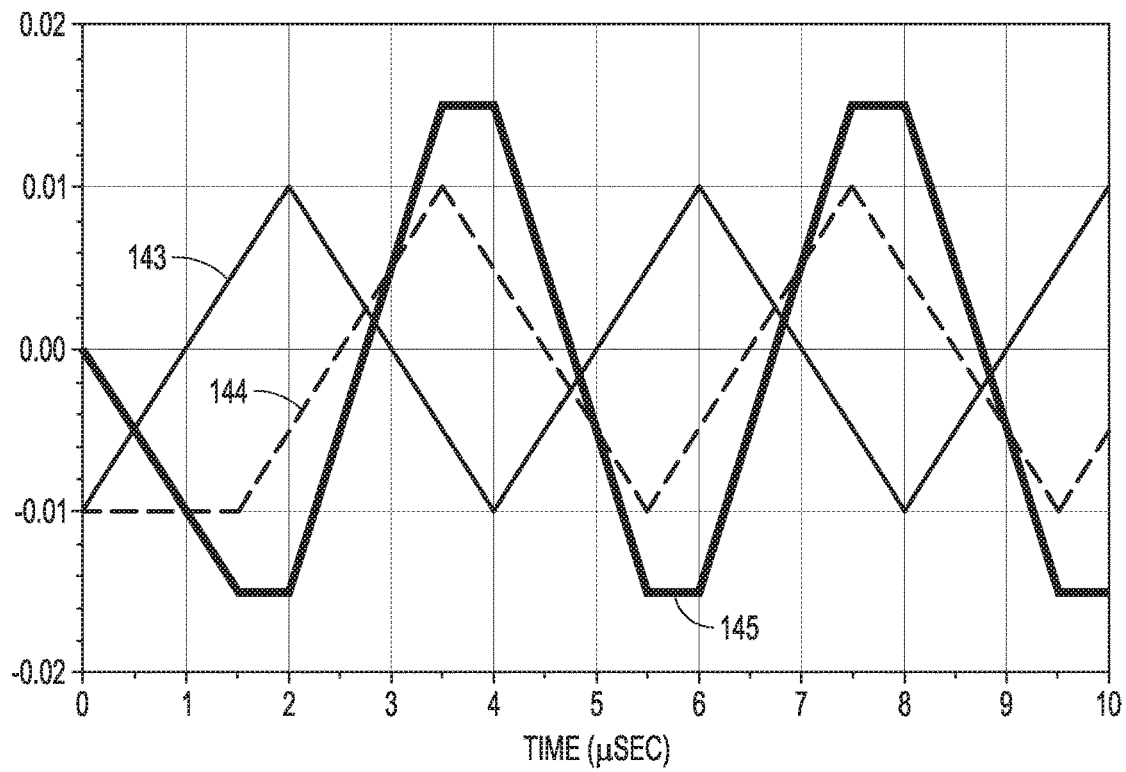

FIG. 1B indicates that offsets in phase will result in large swings in differential voltage between datapath and I/O domains, making domain boundary crossing unnecessarily risky. Curve 143 is a curve of VDDQ and curve 144 is a curve of VDD in which there is a Δ phase between the two voltages. Curve 145 is the differential voltage between datapath and I/O domains of curves 143 and 144.

Figure 1C:
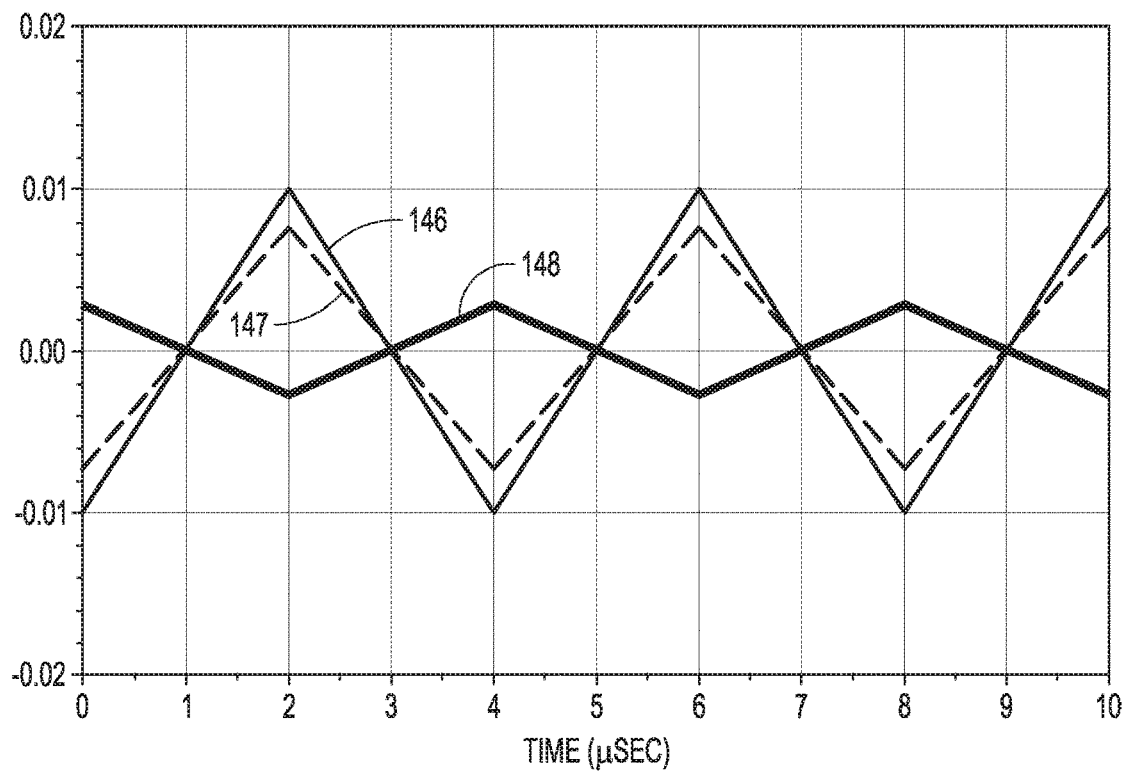

FIG. 1C indicates that offsets in magnitude can result in consistent (predictable) delay variation between the datapath and I/O domains, which may be addressed. Delays generally track. Curve 146 is a curve of VDDQ and curve 147 is a curve of VDD in which there is a Δ magnitude between the two voltages. Curve 148 is the differential voltage between datapath and I/O domains of curves 146 and 147.

Figure 1D:
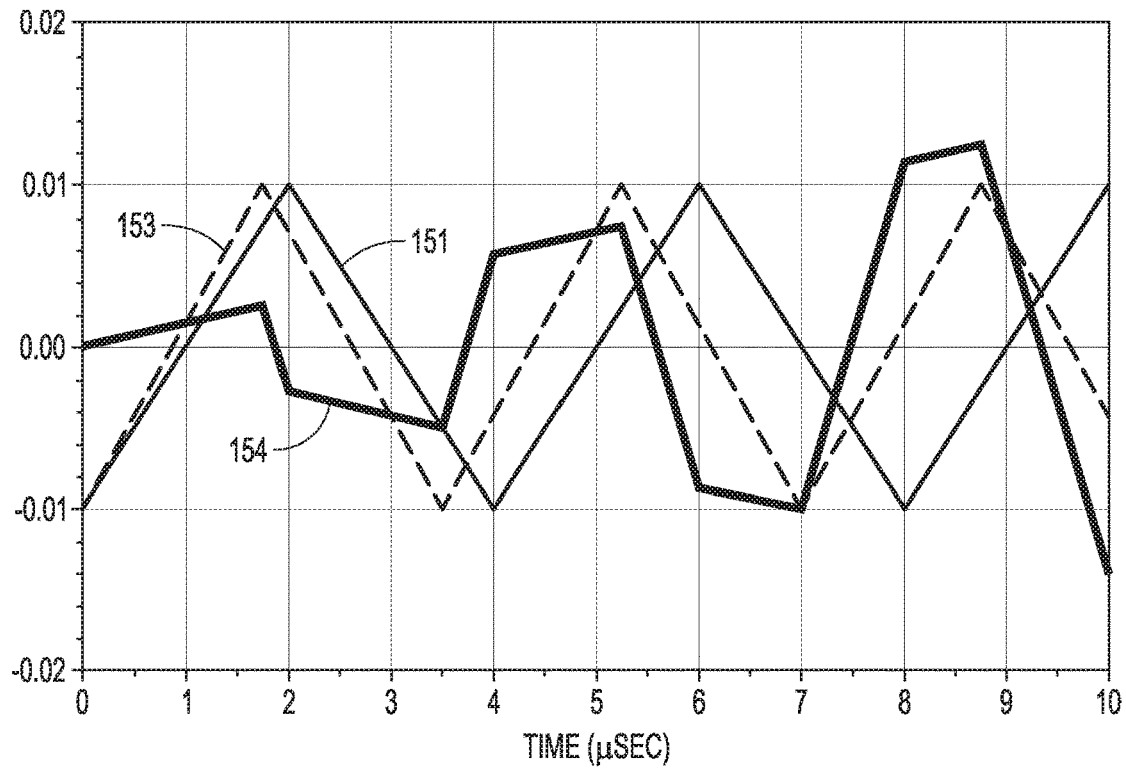

FIG. 1D indicates that offsets in frequency can result in unpredictable and un-trackable differential voltage between datapath and I/O domains, severely increasing risk of internal setup/hold violations within the DRAM. Curve 151 is a curve of VDDQ and curve 153 is a curve of VDD in which there is a Δ frequency between the two voltages. Curve 154 is the differential voltage between datapath and I/O domains of curves 151 and 153.

Figure 2:
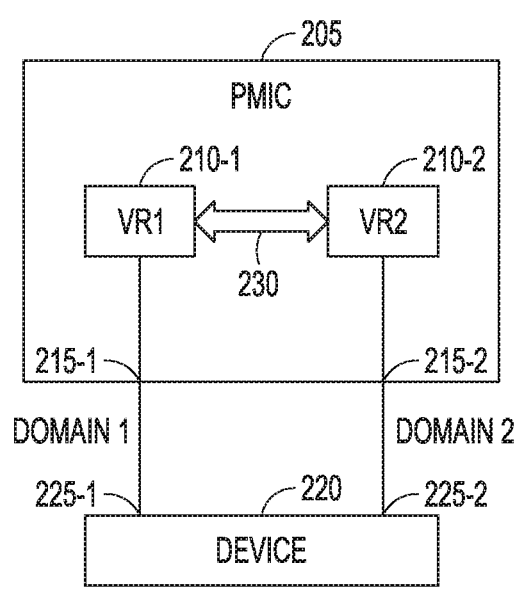
FIG. 2 is a block diagram of an example power management integrated circuit having multiple voltage regulators, according to various embodiments.

FIG. 2 is a block diagram of an embodiment of an example PMIC 205 having multiple VRs. Though PMIC 205 is shown having two VRs, VR 210-1 and VR 210-2, PMIC 205 can have more than two voltage regulators. Output pin 215-1 for VR 210-1 and output pin 215-2 for VR 210-2 are coupled to input pin 225-1 and input pin 225-2, respectively, of an electronic device 220. Electronic device 220 can be, but is not limited to, a memory device. Substantially any electronic device that has multiple inputs for regulated voltages may be used with PMIC 205. A trigger 230 may be generated to initiate phase alignment of VR 210-1 and VR 210-2 such that relative phases of VR ripples at output pin 215-1 for VR 210-1 and output pin 215-2 for VR 210-2 are maintained. The relative phase differences between the voltage regulator ripples at the output pins can be zero. Phase alignment circuitry can be used that is operable to maintain a constant offset. VR 210-1 and VR 210-2 may be structured to provide a voltage at output pin 215-1 of VR 210-1 that is different from a voltage provided at output pin 215-2 of VR 210-2.

Each of VR 210-1 and VR 210-2 can be realized as a pulse width modulated switching regulator having trigger 230 that is common to VR 210-1 and VR 210-2. Trigger 230 may be realized by a ramp oscillator. A controlled delay can be disposed between the common ramp oscillator and ramp oscillator input of each pulse width modulated switching regulator.

PMIC 205 that includes VR 210-1, VR 210-2, and phase alignment circuitry to maintain relative phases of VR ripples at output pins of VR 210-1 and VR 210-2 can be structured as a standalone integrated circuit. PMIC 205 can be disposed in an apparatus that includes one or more circuits, where each circuit can be coupled to output pins of VR 210-1 and VR 210-2 to receive a set of separate regulated voltages. Alternatively, multiple VRs and phase alignment circuitry to maintain relative phases of VR ripples at output nodes of the multiple VRs can be incorporated within the device for which the multiple VRs are to provide regulated voltages. This incorporation effectively disposes PMIC 205 as a component in a larger integrated circuit.

Figure 3:
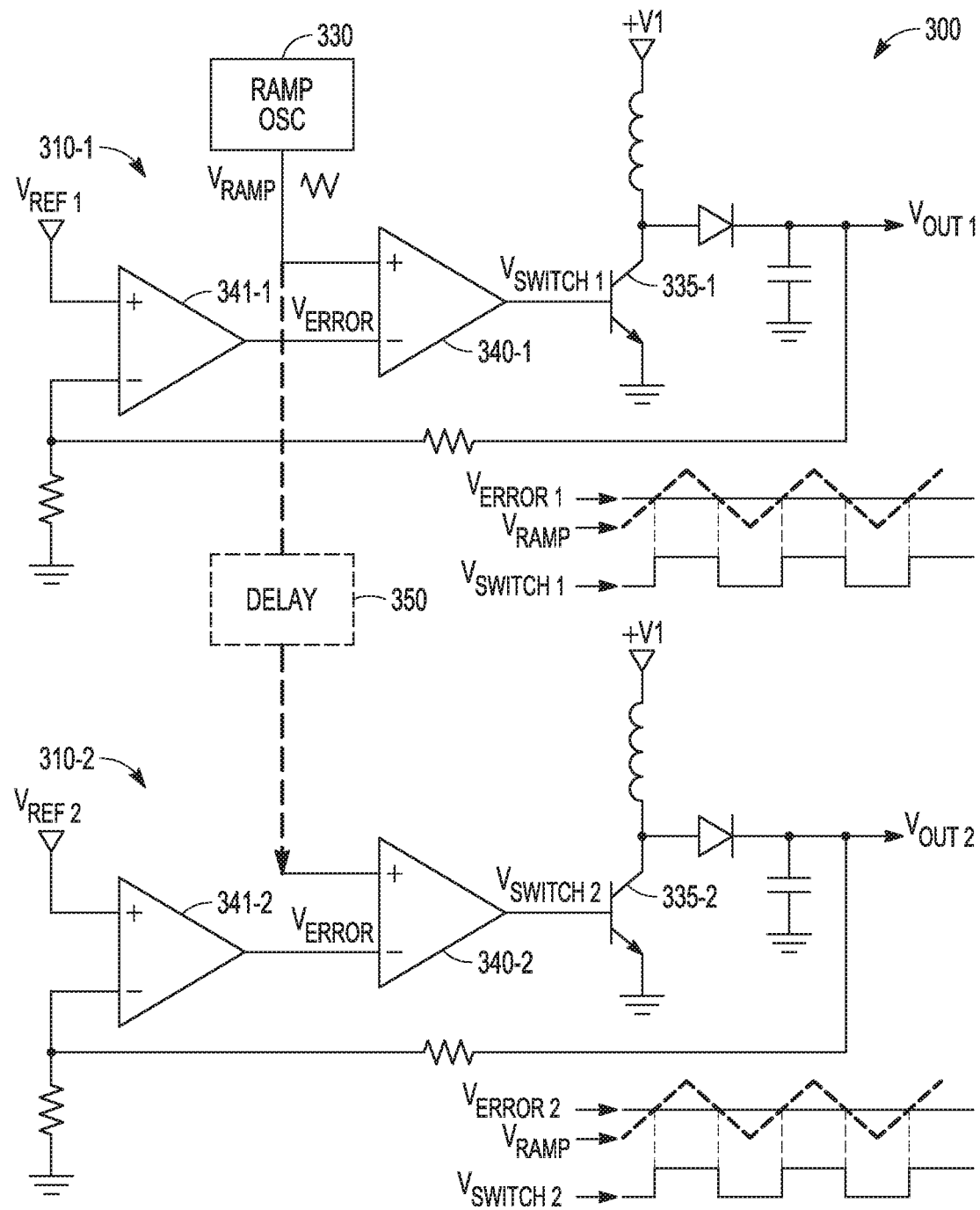
FIG. 3 is a schematic of an example apparatus having multiple voltage regulators, according to various embodiments.

FIG. 3 is a schematic of an embodiment of an example apparatus 300 having multiple VRs 310-1 and 310-2. VRs 310-1 and 310-2 can be realized as pulse width modulated switching regulators having a trigger that is common to VRs 310-1 and 310-2. VR 310-1 provides an output voltage Vout 1, from supply V1, which is fed back to a comparator 341-1 for comparison with a reference voltage Vref 1. The output of comparator 341-1 provides an error, Verror 1, that is compared to a ramp voltage, Vramp, from a ramp oscillator 330, using comparator 340-1, to provide a voltage, Vswitch 1, to switch 335-1. Vswitch 1 can provide a positive pulse when Vramp is greater than Verror.

VR 310-2 provides an output voltage Vout 2, from supply V2, which is fed back to a comparator 341-2 for comparison with a reference voltage Vref 2. The output of comparator 341-2 provides an error, Verror 2, that is compared to ramp voltage, Vramp, from a ramp oscillator 330, using comparator 340-2, to provide a voltage, Vswitch 2, to switch 335-2. Vswitch 2 can provide a positive pulse when Vramp is greater than Verror 2.

The ramp oscillator 330 provides the trigger that is common to VR 210-1 and VR 210-2. Reference voltage Vref 2 may be set equal to reference voltage Vref 1 and V1 may be set equal to V2. Driven by the ramp oscillator trigger, timing may be maintained when Vref 1 and Vref 2 are different. In various embodiments, the gain in comparator stage (340-1/340-2) relative to the target voltage level of comparator stage (341-1/341-2) may be scaled. In other words, if a lower supply is expected not to deviate from nominal by the same degree as a higher voltage supply, then a reduction in comparator gain or the "switch" size may adjust the correction in the lower supply accordingly. This helps to maintain similar ramp characteristics at both outputs Vout 1 and Vout 2. See for example, FIG. 1C. This still results in a differential voltage between the domains, but it is a manageable differential. In various embodiments, VR 310-1 may be arranged to provide Vout 1 to a memory device as VDD and VR 310-2 may be arranged to provide Vout 2 to the memory device as VDDQ.

In various embodiments, a delay 350 may optionally be used to accommodate a fixed phase offset between VR 310-1 and VR 301-2. Delay 350 can be disposed between an input to comparator 340-1 and a corresponding input to comparator 340-2 that is also coupled to ramp oscillator 330. The controlled delay line provides a mechanism to establish a fixed-phase relationship between VR 310-1 and VR 301-2 by delaying the arrival of the trigger. Delay 350 can be realized by a number of conventional delay circuits, such as but not limited to a set of inverters, inductor-capacitor delay lines, or resistor—capacitor circuits.

Figure 4:
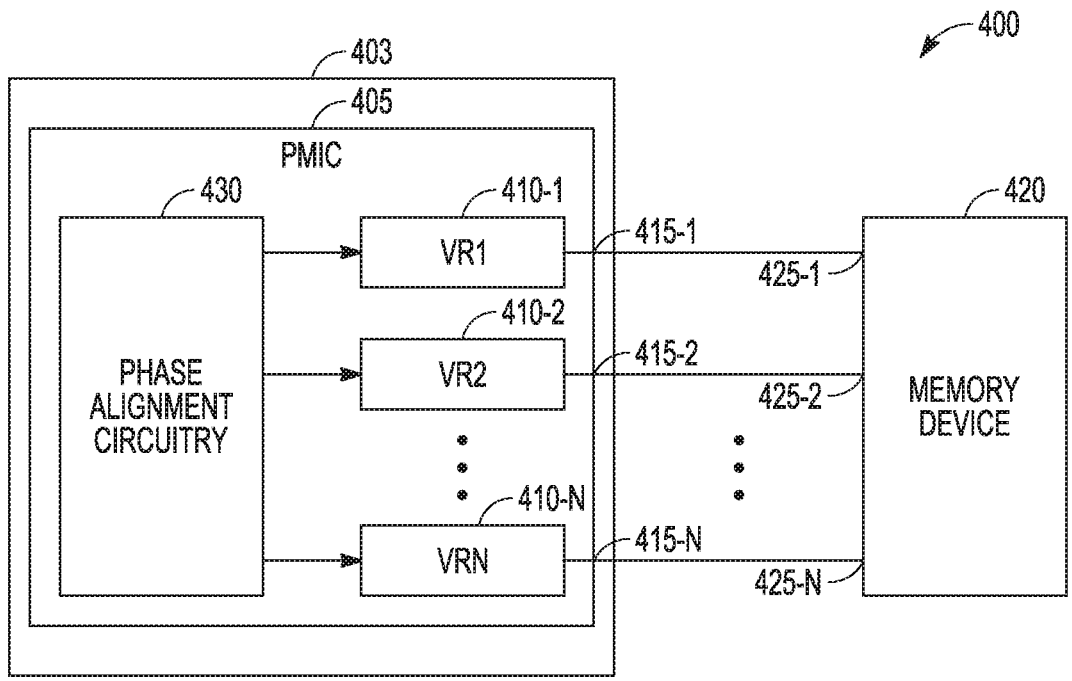
FIG. 4 is a block diagram of an apparatus having a memory device and a power management integrated circuit coupled to the memory device, according to various embodiments.

FIG. 4 is a block diagram of an apparatus 400 having a memory device 420 and a PMIC 405 coupled to the memory device 420. PMIC can include multiple voltage regulators VR 410-1, VR 410-2 . . . VR 410-N, N being an integer greater than or equal to 2, where each voltage regulator has an output pin separate from the output pins of the other voltage regulators of the multiple voltage regulators. Output pin 415-1 of VR 410-1 is coupled to input pin 425-1 of memory device 420. Output pin 415-2 of VR 410-2 is coupled to input pin 425-2 of memory device 420. Output pin 415-N of VR 410-N is coupled to input pin 425-N of memory device 420. The N separate regulated voltages provided by PMIC 405 can provide regulated voltages to N different domains of memory device 420.

PMIC 405 can include phase alignment circuitry 430 coupled to the multiple voltage regulators VR 410-1, VR 410-2 . . . VR 410-N, such that relative phases of voltage regulator ripples at the output pins of these voltage regulators are maintained.

A first output pin of PMIC 405 can be arranged to provide primary supply power to the memory device and a second output pin of PMIC 405 can be arranged to provide potential and energy to drive a load applied to the data output pins or data input/output pins of the memory device 420. The primary supply power may be VDD for memory device 420 realized as a DRAM and the potential may be VDDQ. PMIC 405 may be coupled to memory device 420 by more than two connections to provide voltages to more than two voltage domains of the memory device. The multiple voltage regulators, VR 410-1, VR 410-2 . . . VR 410-N, and the phase alignment circuitry 430 can be disposed in an integrated circuit in a die separate from memory device 420.

The number of voltage regulators, N, may depend on the application. For example, for a fifth generation double data rate (DDR5) memory, there may be at least three domains. One domain can be for VDD, which may be a voltage near 1V for supplying all circuits connecting the chip input/output to the memory array. A second domain can be for VDDQ, which may be a voltage near 1V, feeding the chip input/output circuits, which may be exactly the same level as VDD. A third domain can be for VPP, which may be a higher voltage that feeds a series of regulators on the memory which, in turn, create the wide variety of levels required by the memory array.

For a mobile fifth generation double data rate (LPDDR5) memory, there may be additional domains. One domain can be for VDD1, which is equivalent to VPP above. A second domain can be for VDD2, which is equivalent to VDD above. A third domain can be for VDD2L, which may be a secondary "low" supply, which may be lower than VDD2 that is also referred to as VDD2H for high relative to VDD2L. VDD2L may further be dynamic, allowing the system to raise or lower it within a range based on the performance versus power trade-off. When memory bandwidth demand is low, VDD2L may be reduced "on the fly." A fourth domain can be VDDQ, which may be a voltage around 0.5V feeding the chip input/output circuits for the mobile application.

Each voltage regulator of the multiple voltage regulators, VR 410-1, VR 410-2 . . . VR 410-N, may be a pulse width modulated switching regulator having a trigger that is common to all the voltage regulators of the multiple voltage regulators. The trigger can provided as a ramp oscillator. The pulse width modulated switching regulator may be realized in a manner similar to FIG. 3.

In various embodiments, apparatus 400 can include a memory module 403 having additional memory devices, which may be similar to memory device 420. Each additional memory device can have an input pin coupled to a first output pin of the PMIC 405 that is an output of one of the voltage regulators and can have another input pin coupled to a second output pin of the PMIC 405 that is an output of another one of the voltage regulators. Alternatively, there may be a PMIC for each memory device or a PMIC for a set of memory devices less than all the memory devices on memory module 403.

Figure 5:
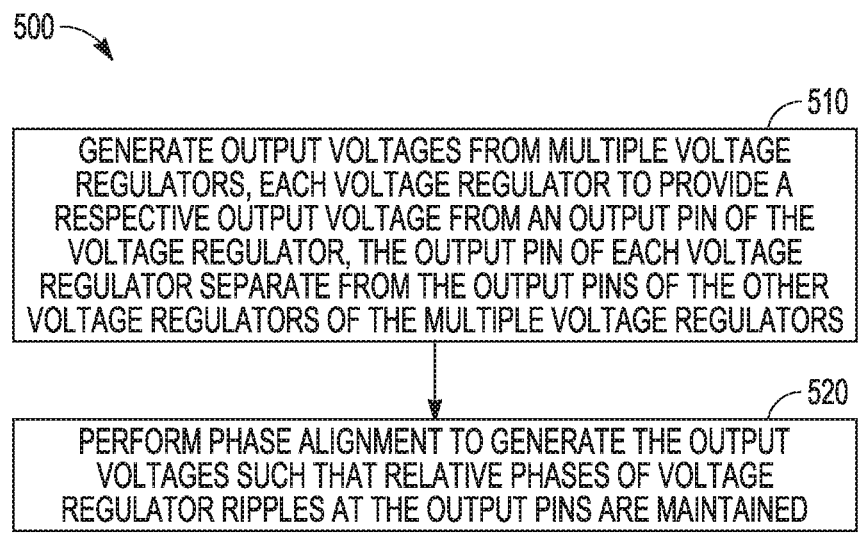
FIG. 5 is a flow diagram of an example method of generating a set of output voltages that can supply a device having multiple voltage domains, according to various embodiments.

FIG. 5 is a flow diagram of an embodiment of an example method 500 of generating a set of output voltages that can supply a device having multiple voltage domains. At 510, output voltages are generated from multiple voltage regulators, each voltage regulator to provide a respective output voltage from an output pin of the voltage regulator, where the output pin of each voltage regulator is separate from the output pins of the other voltage regulators of the multiple voltage regulators. Maintaining relative phases of voltage regulator ripples at the output pins can include maintaining relative phase differences between the voltage regulator ripples at the output pins at zero phase differences. Generating output voltages from the multiple voltage regulators can include generating the output voltage from a pulse width modulated switching regulator having a ramp oscillator that is common to all the voltage regulators of the multiple voltage regulators. Variations of methods similar to method 300 can include providing a controlled delay between the common ramp oscillator and ramp oscillator input of each pulse width modulated switching regulator.

At 520, phase alignment is performed to generate the output voltages such that relative phases of voltage regulator ripples at the output pins are maintained. The phase alignment can use circuitry coupled to the multiple voltage regulators. Performing phase alignment to generate the output voltages can include using a common trigger signal to the multiple voltage regulators disposed in a common integrated circuit. Performing phase alignment can include providing the phase alignment that maintains a constant offset.

Variations of methods similar to method 500 can include providing the output voltages from the multiple voltage regulators to one or more circuits, each circuit coupled to selected output pins of the multiple voltage regulators to receive a set of the output voltages.

Figure 6:
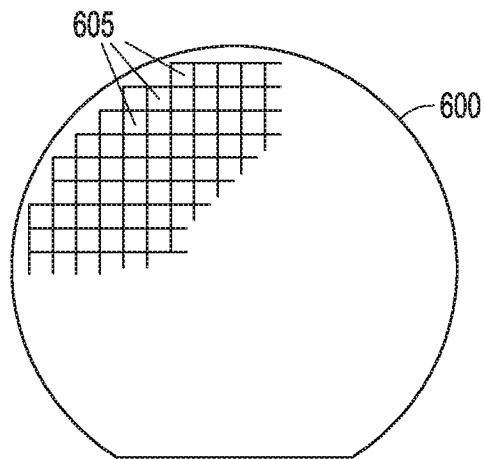
FIG. 6 illustrates an example of a wafer arranged with power management integrated circuits, according to various embodiments.

FIG. 6 illustrates an embodiment of an example of a wafer 600 arranged to provide multiple electronic components. Wafer 600 can be provided as a wafer in which a number of dice 605 can be fabricated. Alternatively, wafer 600 can be provided as a wafer in which the number of dice 605 have been processed to provide electronic functionality and are awaiting singulation from wafer 600 for packaging. Wafer 600 can be provided as a semiconductor wafer, a semiconductor on insulator wafer, or other appropriate wafer for processing electronic devices such as an integrated circuit chips.

Using various masking and processing techniques, each die 605 can be processed to include functional circuitry such that each die 605 is fabricated as an integrated circuit with the same functionality and packaged structure as the other dice on wafer 600. Alternatively, using various masking and processing techniques, various sets of dice 605 can be processed to include functional circuitry such that not all of the dice 605 are fabricated as an integrated circuit with the same functionality and packaged structure as the other dice on wafer 600. A packaged die having circuits integrated thereon providing electronic capabilities is herein referred to as an integrated circuit (IC).

Wafer 600 can comprise multiple dice 605. Each die 605 of the multiple dice can be structured as a PMIC. The PMIC can include multiple voltage regulators, where each voltage regulator has an output pin separate from the output pins of the other voltage regulators of the multiple voltage regulators. The PMIC can include phase alignment circuitry coupled to the multiple voltage regulators such that, in operation, relative phases of voltage regulator ripples at the output pins are maintained. The PMIC may be structured similar or identical to PMICs associated with FIGS. 2-5.

Figure 7:
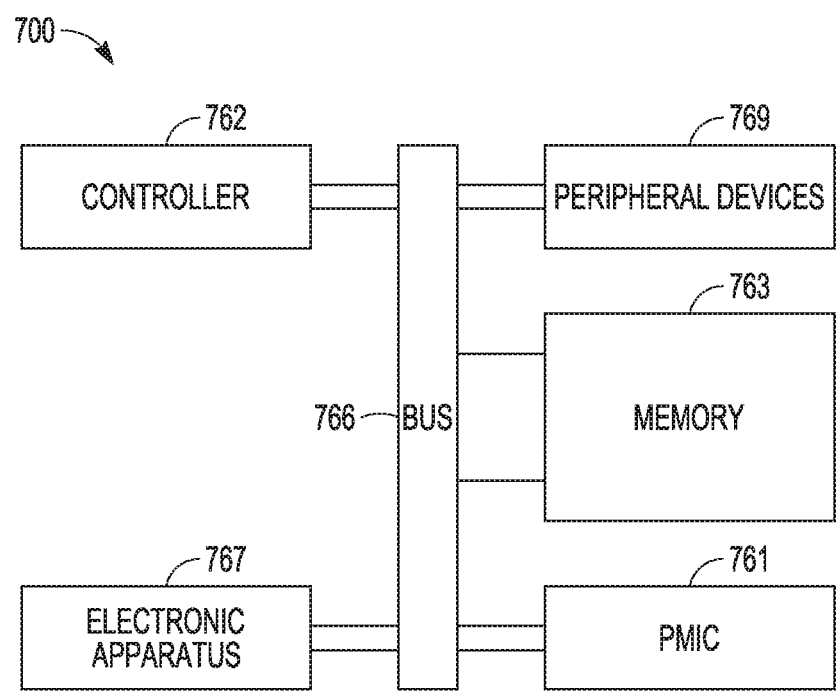
FIG. 7 shows a block diagram of a system that includes a power management integrated circuit, according to various embodiments

FIG. 7 shows a block diagram of an embodiment of an example system 700 that includes one or more PMICs 761. PMICs 761 can be structured as taught herein and can provide multiple regulated voltages to one or more components of system 700. System 700 can include a controller 762 operatively coupled to memory 763. System 700 can also include an electronic apparatus 767 and peripheral devices 769. One or more of controller 762, memory 763, electronic apparatus 767, or peripheral devices 769 can be in the form of one or more ICs.

A bus 766 provides electrical conductivity between and/or among various components of system 700. Bus 766 can include a power bus. In an embodiment, bus 766 can include an address bus, a data bus, and a control bus, each independently configured. In an alternative embodiment, bus 766 can use common conductive lines for providing one or more of address, data, or control, the use of which is regulated by controller 762. Controller 762 can be in the form or one or more processors.

Electronic apparatus 767 may include additional memory. Memory in system 700 may be constructed as one or more types of memory such as, but not limited to, dynamic random access memory (DRAM), static random access memory (SRAM), synchronous dynamic random access memory (SDRAM), synchronous graphics random access memory (SGRAM), double data rate dynamic ram (DDR), double data rate SDRAM, and magnetic based memory.

Peripheral devices 769 may include displays, imaging devices, printing devices, wireless devices, additional storage memory, and control devices that may operate in conjunction with controller 762. In various embodiments, system 700 includes, but is not limited to, fiber optic systems or devices, electro-optic systems or devices, optical systems or devices, imaging systems or devices, and information handling systems or devices such as wireless systems or devices, telecommunication systems or devices, and computers.

Power management structures, as taught herein, provide a mechanism to deliver separate regulated power sources. These regulated power sources can provide a number of regulated voltages from outputs of the power management structures to electronic devices that operate based on a set of different voltage domains. Such power management structures may realized in various embodiments as PMICs having a number of voltage output pins. Without controller frequency and/or phase, a differential voltage between output pins of a conventional PMIC can form, which may result in challenging domain boundary crossings for any sourced components. For example, VDDQ on a DRAM and a corresponding supply for the other end of the interface or VDD and VDDQ on a DRAM may present such challenging domain boundary crossings for a conventional PMIC. Such a differential voltage may likely need to be absorbed as a component of the link timing budget, and may ultimately reduce signaling margins and performance. Controlling the frequency and phase between output pins of a PMIC, as taught herein, may eliminate or limit differential voltage accumulated between voltage domains sourced by distinct pins of the PMIC. This property could simplify circuit design and increase signaling margins, for example for setup/hold in a DRAM.

As the electronics industry moves forward in developing smaller, more functionally powerful electronic devices, timing budgets for many of these electronic devices are an issue with which the industry struggles. In contrast to clocking approaches that may add power and complexity to the circuit design and/or introduce reliability risks, the approach to address differential domain behavior, as taught herein, may provide significant relief.

Although specific embodiments have been illustrated and described herein, it will be appreciated by those of ordinary skill in the art that other arrangements derived from the teachings herein may be substituted for the specific embodiments shown. Various embodiments use permutations and/or combinations of embodiments described herein. It is to be understood that the above description is intended to be illustrative, and not restrictive, and that the phraseology or terminology employed herein is for the purpose of description. Combinations of the above embodiments and other embodiments will be apparent to those of skill in the art upon studying the above description.

What is claimed is:

1. An apparatus comprising:
   multiple voltage regulators, each voltage regulator having an output pin separate from the output pins of the other voltage regulators of the multiple voltage regulators; and
   phase alignment circuitry coupled to the multiple voltage regulators such that relative phases of voltage regulator ripples at the output pins are maintained.

2. The apparatus of claim 1, wherein relative phase differences between the voltage regulator ripples at the output pins of two voltage regulators of the multiple voltage regulators is zero, with the two voltage regulators arranged to couple to a device to feed two different domains of the device.

3. The apparatus of claim 1, wherein at least one of the voltage regulators is structured to provide a voltage at its output pin different from the voltages at the output pins of the other voltage regulators.

4. The apparatus of claim 1, wherein each voltage regulator of the multiple voltage regulators is a pulse width modulated switching regulator having a trigger that is common to all the voltage regulators of the multiple voltage regulators, with each voltage regulator having a feedback from the respective output pin of the voltage regulator to compare to a reference voltage.

5. The apparatus of claim 4, wherein the trigger that is common to all the voltage regulators of the multiple voltage regulators is a ramp oscillator.

6. The apparatus of claim 4, wherein a controlled delay is disposed between the common ramp oscillator and ramp oscillator input of each pulse width modulated switching regulator.

7. The apparatus of claim 1, wherein the phase alignment circuitry are operable to maintain a constant offset, with two voltage regulators of the multiple voltage regulators coupled to a device to feed two different domains of the device.

8. The apparatus of claim 1, wherein the multiple voltage regulators and the phase alignment circuitry are disposed in an integrated circuit.

9. The apparatus of claim 1, where the apparatus includes one or more circuits, each circuit coupled to selected output pins of the multiple voltage regulators to receive a set of separate regulated voltages.

10. An apparatus comprising:
    a memory device; and
    a power management integrated circuit coupled to the memory device by at least two connections, one input pin of the memory device coupled to a first output pin of the power management integrated circuit and another input pin of the memory device coupled to a second output pin of the power management, the power management integrated circuit including:
       multiple voltage regulators, each voltage regulator having an output pin separate from the output pins of the other voltage regulators of the multiple voltage regulators, the first output pin being the output pin of one of the voltage regulators and the second output pin being the output pin of another one of the voltage regulators; and
       phase alignment circuitry coupled to the multiple voltage regulators such that relative phases of voltage regulator ripples at the output pins are maintained.

11. The apparatus of claim 10, wherein the first output is arranged to provide primary supply power to the memory device and the second output pin is arranged to provide potential and energy to drive a load applied to the data output pins or data input/output pins of the memory device.

12. The apparatus of claim 10, wherein the power management integrated circuit is coupled to the memory device by more than two connections to provide voltages to more than two voltage domains of the memory device.

13. The apparatus of claim 10, wherein each voltage regulator of the multiple voltage regulators is a pulse width modulated switching regulator having a trigger that is common to all the voltage regulators of the multiple voltage regulators, with each voltage regulator having a feedback from the respective output pin of the voltage regulator to compare to a reference voltage.

14. The apparatus of claim 13, wherein the trigger is a ramp oscillator.

15. The apparatus of claim 10, wherein the multiple voltage regulators and the phase alignment circuitry are disposed in an integrated circuit in a die separate from the memory device.

16. The apparatus of claim 10, wherein the apparatus includes a memory module having additional memory devices, each additional memory device having an input pin coupled to the first output pin of the power management integrated circuit and another input pin coupled to the second output pin of the power management integrated circuit.

17. A method comprising:
    generating output voltages from multiple voltage regulators, each voltage regulator providing a respective output voltage from an output pin of the voltage regulator, the output pin of each voltage regulator separate from the output pins of the other voltage regulators of the multiple voltage regulators; and
    performing phase alignment to generate the output voltages such that relative phases of voltage regulator ripples at the output pins are maintained, the phase alignment using circuitry coupled to the multiple voltage regulators.

18. The method of claim 17, wherein maintaining relative phases of voltage regulator ripples at the output pins includes maintaining relative phase differences between the voltage regulator ripples at the output pins at zero phase differences, with the multiple voltage regulators coupled to a memory device.

19. The method of claim 17, wherein performing phase alignment to generate the output voltages includes using a common trigger signal to the multiple voltage regulators disposed in a common integrated circuit, with the multiple voltage regulators coupled to a memory device.

20. The method of claim 17, wherein generating output voltages from the multiple voltage regulators includes generating the output voltage from a pulse width modulated switching regulator having a ramp oscillator that is common to all the voltage regulators of the multiple voltage regulators, with each voltage regulator having a feedback from the respective output pin of the voltage regulator to compare to a reference voltage.

21. The method of claim 20, wherein the method includes providing a controlled delay between the common ramp oscillator and ramp oscillator input of each pulse width modulated switching regulator.

22. The method of claim 17, wherein the method includes providing the phase alignment that maintains a constant offset at the output pins of two voltage regulators of the multiple voltage regulators at zero, with the two voltage regulators coupled to a device to feed two different domains of the device.

23. The method of claim 17, wherein the method includes providing the output voltages from the multiple voltage regulators to one or more circuits, each circuit coupled to selected output pins of the multiple voltage regulators to receive a set of the output voltages at different voltage levels.

* * * * *